United States Patent
Shah et al.

(10) Patent No.: US 10,921,371 B2
(45) Date of Patent: Feb. 16, 2021

(54) PROGRAMMABLE SCAN SHIFT TESTING

(71) Applicant: Seagate Technology LLC, Cupertino, CA (US)

(72) Inventors: Jay Shah, Ahmedabad (IN); Aniruddha Mukund Bhasale, Pune (IN)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 151 days.

(21) Appl. No.: 15/641,690

(22) Filed: Jul. 5, 2017

(65) Prior Publication Data

US 2019/0011500 A1 Jan. 10, 2019

(51) Int. Cl.
| | | |
|---|---|---|
| *G01R 31/28* | (2006.01) | |
| *G01R 31/3177* | (2006.01) | |
| *G01R 31/317* | (2006.01) | |
| *G01R 31/3185* | (2006.01) | |

(52) U.S. Cl.
CPC ... *G01R 31/3177* (2013.01); *G01R 31/31723* (2013.01); *G01R 31/31724* (2013.01); *G01R 31/31727* (2013.01); *G01R 31/318544* (2013.01); *G01R 31/318555* (2013.01); *G01R 31/318558* (2013.01)

(58) Field of Classification Search
CPC .......... G01R 31/3177; G01R 31/31723; G01R 31/31724; G01R 31/31727; G01R 31/318544; G01R 31/318555; G01R 31/318558
USPC ........ 714/729, 726, 727, 728, 732, 733, 734
See application file for complete search history.

(56) References Cited

U.S. PATENT DOCUMENTS

| | | | |
|---|---|---|---|
| 5,043,986 A * | 8/1991 | Agrawal ........ | G01R 31/318583 714/731 |
| 5,592,493 A | 1/1997 | Crouch et al. | |
| 5,983,380 A * | 11/1999 | Motika ......... | G01R 31/318385 714/733 |
| 6,490,702 B1 * | 12/2002 | Song ............ | G01R 31/318541 714/726 |
| 2005/0188290 A1 * | 8/2005 | Motika ......... | G01R 31/311 714/733 |
| 2011/0166818 A1 * | 7/2011 | Lin .............. | G01R 31/318575 702/117 |
| 2015/0338461 A1 * | 11/2015 | Wang ............ | F16C 19/381 714/727 |
| 2018/0059178 A1 * | 3/2018 | Wang ............ | G01R 31/318541 |

OTHER PUBLICATIONS

DFTMAX Design-for-Test User Guide, Version M-2016.12-SP2, Mar. 2017, Synopsys, Inc., Sections 18-32 and 18-35.

* cited by examiner

*Primary Examiner* — Christine T. Tu
(74) *Attorney, Agent, or Firm* — Holzer Patel Drennan

(57) ABSTRACT

The disclosed technology facilitates programmable scan shift testing for a scan chain including at least a first segment of scan-flops connected in series with a second segment of scan-flops. The scan chain includes at least a first multiplexor positioned between the first segment and the second segment that is configured to selectively supply scan input from a test controller to the second segment while preventing the second segment from receiving an output of the first segment.

16 Claims, 8 Drawing Sheets

US 10,921,371 B2

PROGRAMMABLE SCAN SHIFT TESTING

BACKGROUND

Scan chain testing is method of testing semiconductor chips for manufacturing defects. Semiconductor chips such as system-on-chips (SoCs) and application-specific integrated circuits (ASICs) are generally designed to stitch flip-flops (e.g., memory cells) present in the design that can be enabled in either functional mode or test mode. When in the test mode, each flip-flop in the design is connected into a chain that functions as a long shift register. During testing of the chip (also referred to as "scan chain testing"), a test pattern is loaded in the cells of the chain by allowing a clock pulse (also called the shift pulse) to toggle number of times equal to maximum number of cells present in the chain. Then the functional mode is entered, and another clock pulse (also called the capture pulse) is allowed to excite a combinatorial logic block to toggle memory states of the cells. This toggling activity generates an output at each cell that can then be 'shifted' down and out of the chain of cells, providing a signature at a scan output port that can be compared with an expected signature. This process may be repeated for multiple test patterns until adequate fault coverage is obtained.

As the size and complexity of integrated circuits increases, scan chain testing of these circuits grows increasingly difficult. A thorough scan test sequence may test millions of cells, with some test patterns toggling so many cells at once that a power draw during testing may exceed normal functional power expectations and/or limitations of the chip.

SUMMARY

Implementations described and claimed herein provide programmable scan chain testing to reduce current drawn during a scan chain test. According to one implementation, a scan chain includes a first segment of scan-flops connected in series with a second segment of scan-flops and the second segment is configured to receive an output from the first segment. A first multiplexor is positioned between the first segment and the second segment and configured to selectively supply test controller input to the second segment while preventing the second segment from receiving an output of the first segment This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. These and various other features and advantages will be apparent from a reading of the following Detailed Description.

BRIEF DESCRIPTIONS OF THE DRAWINGS

DETAILED DESCRIPTION

Figure 1:
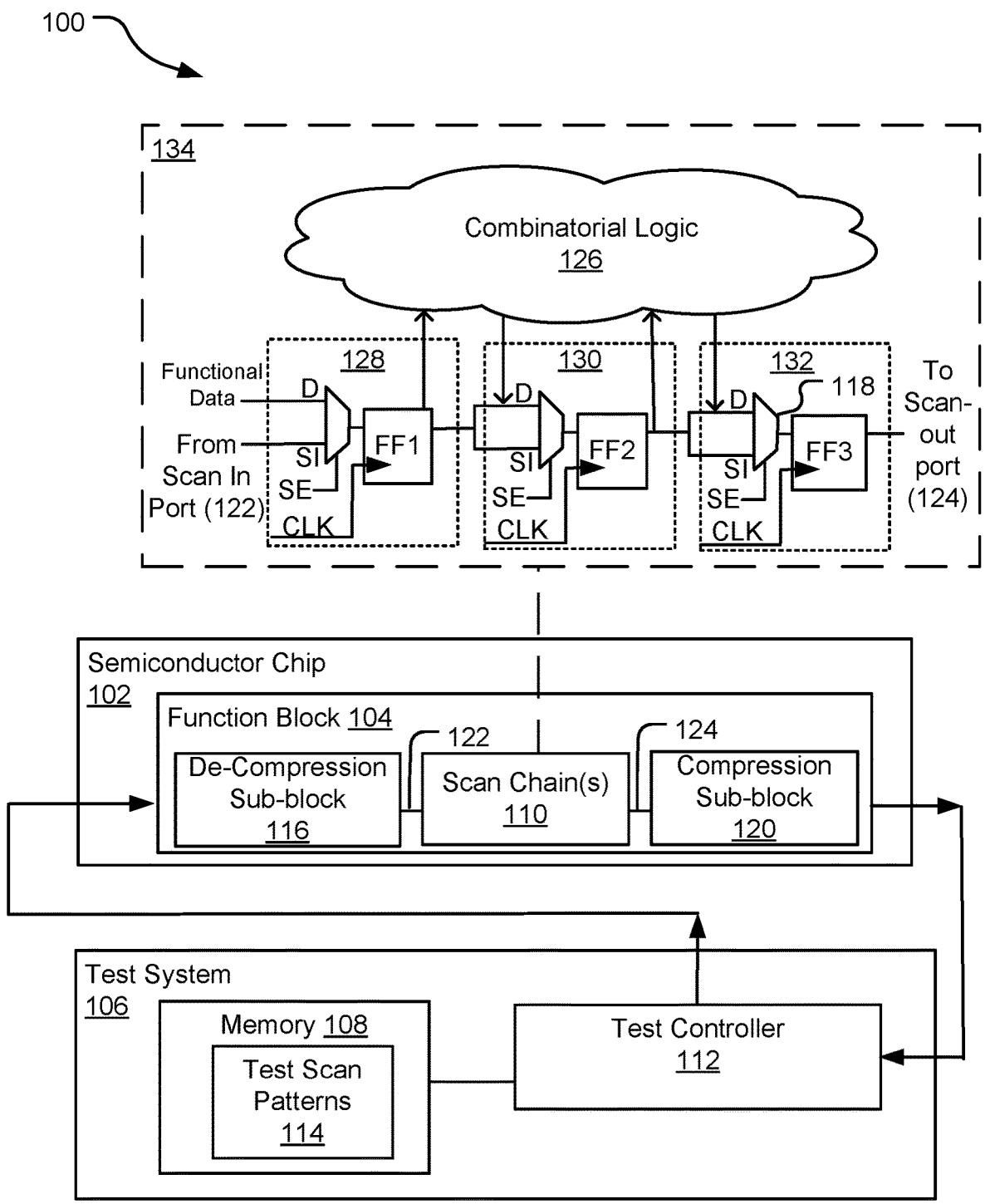
FIG. 1 illustrates an example system for testing a semiconductor chip for defects.

FIG. 1 illustrates an example system 100 for testing a semiconductor chip 102 for defects. The semiconductor chip 102 (also referred to herein as an integrated circuit (IC)) includes one or more function blocks (e.g., a user function block 104), and each function block includes one or more scan chains (e.g., a scan chain 110) for performing scan tests on the associated function block. During testing, the semiconductor chip 102 is connected to a test system 106 by one or more wired or wireless connections that supply power to the semiconductor chip 102 and facilitate bidirectional data flows. In general, the test system 106 provides power and test inputs to the function blocks of the semiconductor chip 102 and also processes output signals from the function blocks to identify the existence and/or location of potential defects.

The testing system 106 includes memory 108 for storing one or more test scan patterns 114. During a test sequence referred to herein as "scan chain testing," the test controller 112 selects test scan patterns 114 and transmits control signals to the user function block 104 for selectively programming (loading) individual elements of the scan chain 110 with values of each selected test scan pattern, as described below. Prior to loading, values of a selected test scan pattern are decompressed by de-compression logic 116 and provided to a scan-in port 122 of the scan chain 110. In a final stage of testing for each of the test scan patterns 114, values stored in the scan chain 110 are unloaded at a scan-out port 124, compressed by the compression sub-block 120, and transmitted back to the test controller 112 for processing.

An example portion 134 of the scan chain 110 includes a number of flip-flops (e.g., FF1, FF2, FF3) connected in series. Each of the flip-flops is provided with inputs through a corresponding multiplexor (also referred to as a mux) (e.g., multiplexor 118). The multiplexors each selectively supply the corresponding flip-flop with either a functional data input (labeled 'D') or a scan input (labeled "SI") from the test controller 112. During a functional mode of operation, each of the flip-flops in the scan chain 110 receives data from the functional data input. During a test mode of operation, each of the flip-flops receives data from the SI input. Each flip-flop and its corresponding multiplexor are together herein referred to as a "scan-flop" (e.g., scan-flops 128, 130, and 132). The different scan-flops 128, 130, and 132 are connected in a serial shift register fashion during a test mode such that the output of each scan-flop becomes an input to the next scan-flop when the SI input is selected.

In one implementation, a scan chain test sequence includes three phases: loading or "shift-in", capture, and un-loading or "shift-out." An initial loading phase is initiated by configuring the scan-flops for the test mode by asserting '1' values along selection lines (SE) to selecting the SI inputs and loading one of the test scan patterns 114 (e.g., a sequence of 1's and 0's) into the scan-flops in the chain 110. During the "capture" phase of the scan chain test, the SE input is then de-asserted to select function ("D") input of a cell, allowing the scan-flops to operate in the normal functional mode and capture system data at the D-inputs for one or more clock cycles. When a clock pulse (CLK) is allowed to excite the scan-flops, a combinatorial logic block 126 receives as inputs the outputs of each of the scan-flops as well as other system inputs. The combinatorial logic block 126 then performs a combinatorial logic function on the inputs received from each one of the scan-flops to produce a logic function output that is, in turn, and provided as the input to the next one of the scan-flops in the scan chain 110. After this toggling, the "un-loading" or "shift-out" phase commences, during which time the SE input is re-asserted to select SI inputs and the values in the scan chain are shifted out, compressed by the compression sub-block 120 and transmitted back to the test system 106 to determine if the captured values match an expected signature.

The number of shift-in and shift-out cycles for each pattern is equal to the maximum number of scan-flops that are part of the scan chain 110. During the shift-in and shift-out cycles, toggling of memory states may occur at the output of each of the scan-flops within the scan chain 110 and also within the combinatorial logic block 126. This observed toggling can, at times, draw more current from a voltage supply during a test than during the normal functional operational mode of the chip. In some cases, high toggling activity can create localized hot spots that may cause the chip to fail during testing and/or cause permanent damage. Designing a semiconductor chip to adequately dissipate heat during testing may entail adding features to the chip that are not otherwise essential to support the normal functional mode of the chip. For example, some semiconductor chips being developed to include features for heat dissipation exclusively tailored to support the test mode that are unnecessary for device operation in the normal functional mode. This 'overdesigning' of semiconductor chips increases manufacturing costs. Thus, there exists motivation to decrease the total amount of toggling that occurs during scan chain testing without decreasing test fault coverage.

In addition to the above-described power-related challenges of scan-chain circuit testing, it can also be difficult to identify the locations of detected faults particularly when the scan chains are very long (e.g., millions of individual scan-flops). Many scan chain designs do not provide sufficient test granularity. For example, many designs do not facilitate testing of individual chains in isolation of one another or individual segments within a chain.

According to one implementation of the disclosed technology, the scan chain 110 includes circuitry components that facilitate selective, isolated testing of individual segments of the scan chain 110 such that one portion of the scan chain 110 can be tested without causing any toggling in another portion of the scan chain 110. In another implementation, the scan chain 110 includes circuitry components that facilitate selective testing of individual chains within a functional block in isolation from one another. Both of these solutions reduce power draw and simplify debugging. Various examples are described in greater detail with respect to the following figures.

Figure 2:
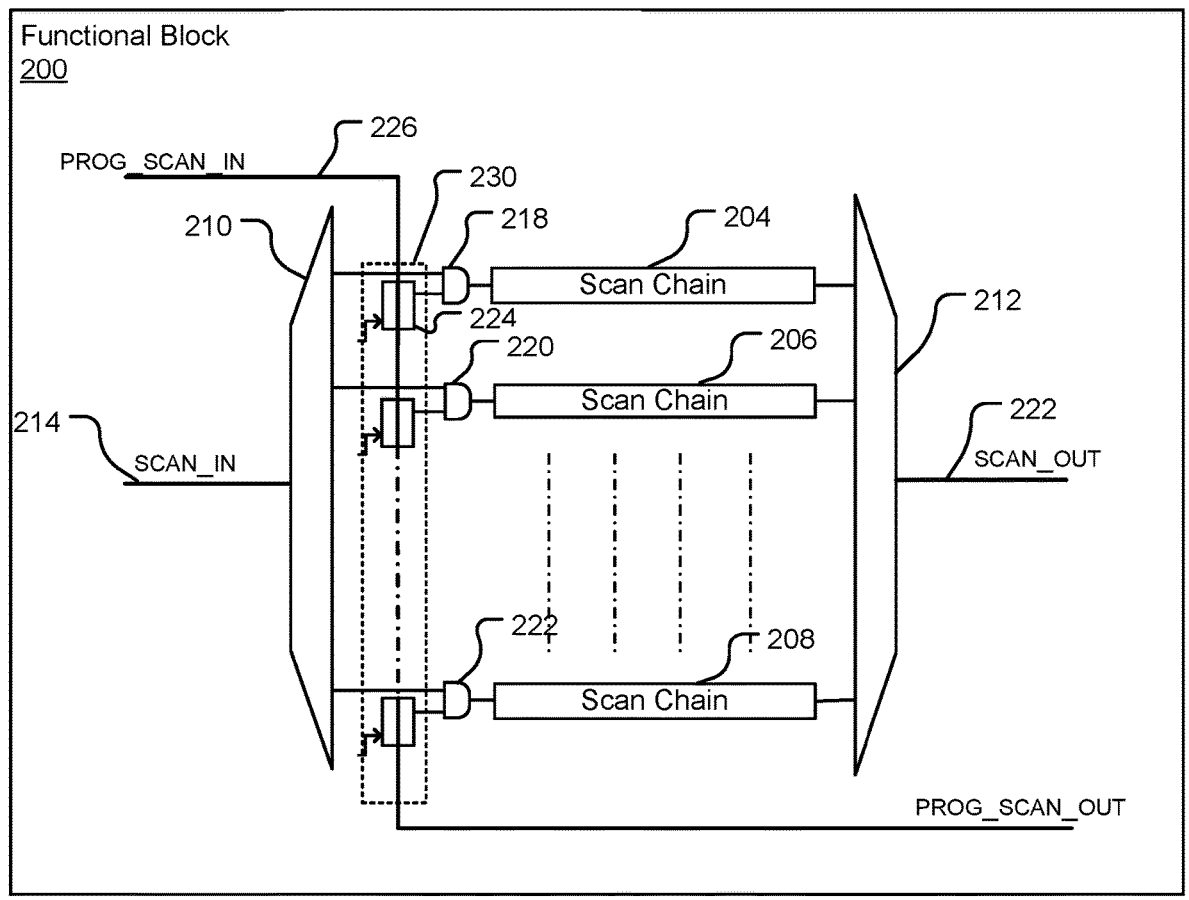
FIG. 2 illustrates an example functional block of a semiconductor chip that includes circuitry to decrease toggling activity during scan chain testing without decreasing fault coverage.

FIG. 2 illustrates an example functional block 200 of a semiconductor chip that includes circuitry to decrease toggling activity during scan chain testing without decreasing fault coverage. In one implementation, decreased toggling activity is achieved during testing by isolating toggling to select scan chains 204, 206, or 208.

Each of the scan chains 204, 206, and 208 of the functional block 200 extends between a de-compressor logic block 210 and a compression logic block 212. Although not shown in detail, each one of the scan chains 204, 206, and 208 includes a number of scan-flops arranged in series, such as in manner the same or substantially similar to the scan-flop arrangement described with respect to FIG. 1.

In some semiconductor chips, it can be difficult and/or impossible to identify which of many different scan chains is the source of a discovered defect without some mechanism to isolate and test individual chains independent of one another. For example, combinatorial logic within such as within the compression logic block 212 may combine outputs from various scan chains (e.g., the scan chains 204, 206, and 208) into a compressed output that is observed as output along a scan_out line 228. When the compressed output does not match an expected output, it can therefore be difficult to identify the source of the fault.

To address the foregoing, the functional block 200 includes gates (e.g., AND gates 218, 220, 222) at a leading edge of each of the scan chains 204, 206, and 208, respectively. Each of the gates 218, 220, 222 is loaded by a corresponding a flip-flop in a series 230 of flip-flops configured to receive data along a secondary scan-in port 226.

In one example testing scenario, a pattern of 1's and 0's is loaded to the series 230 of leading flip flops from the secondary scan-in port 226. These values effectively set some of the scan chains 204, 206, and 208 in an "on" state while keeping the remaining scan chains in an "off" state. As used herein, the terms "on" and "off" refer to the configurational capability of a scan element (e.g., a scan chain or scan chain segment) to output a non-zero value. When a scan element is "off," the scan element outputs exclusively zeros. The term "masking" is used herein to refer to refer to selective placement of a scan element in an off statement. For example, a particular scan chain is said to be "masked" when placed in the "off" state.

In the example of FIG. 2, the scan chain 204 is in the "off" state when the secondary scan-in port 226 loads the leading flip-flop 224 with a "0" because the corresponding AND gate 218 outputs exclusively 0s regardless of test pattern values loaded from a primary scan-in port 214. On the other hand, the scan chain 204 is in the "on" state when the leading flip-flop 224 is loaded with a "1." In this case, the scan chain 204 is loaded with the sequence of test values provided by the primary scan-in port 214. As a result of the above-described gating, the compression logic block 212 receives all 0s from scan chains that are placed selectively in the "off" state. This allows for testing of the scan chains 204, 206, 208 individually and/or in various selected sub-combinations.

Figure 3:
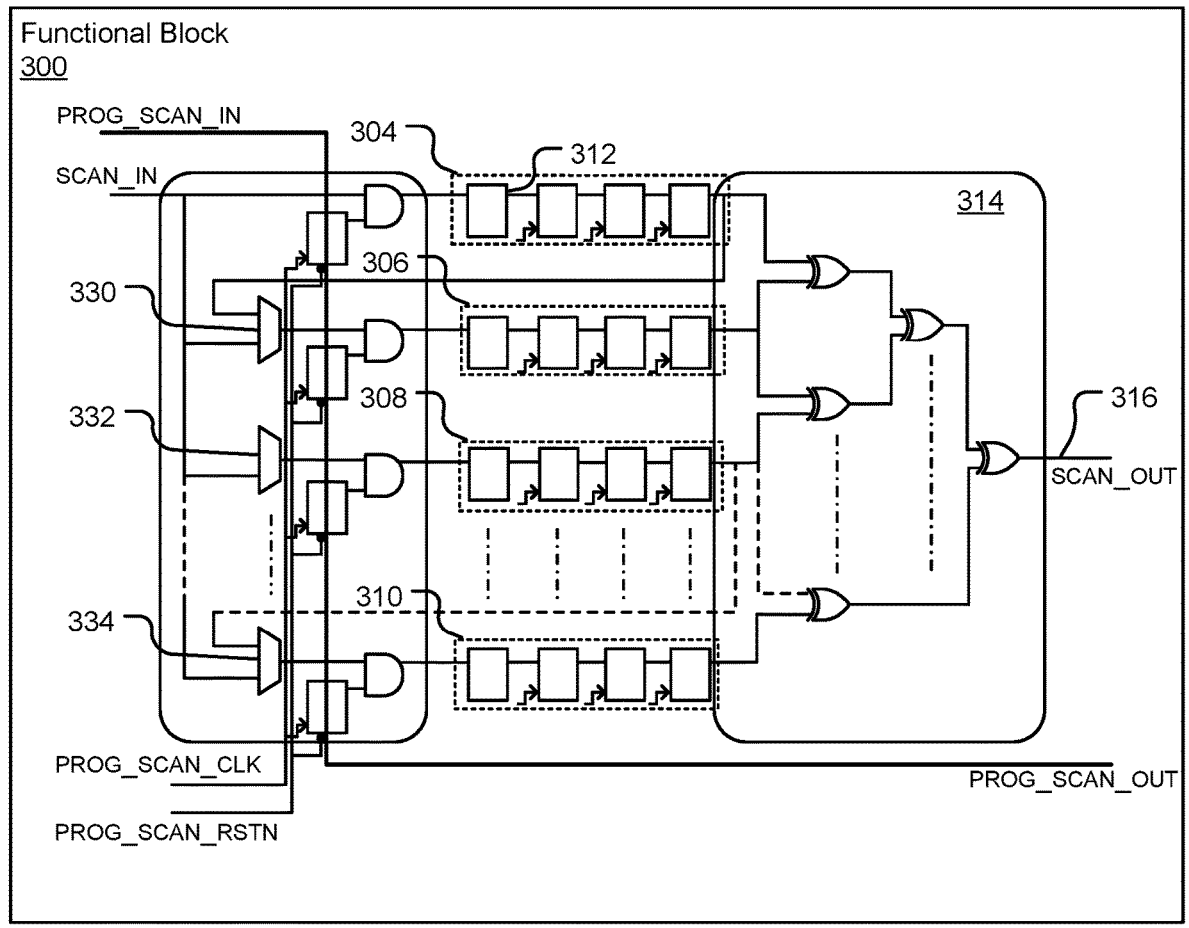
FIG. 3 illustrates another example functional block of a semiconductor chip that includes circuitry that facilitates selective isolation individual scan chains during testing.

FIG. 3 illustrates another example functional block 300 of a semiconductor chip that includes circuitry that facilitates selective isolation of individual scan chains (e.g., scan chains 304, 306, 308, and 310) during testing. Each one of the scan chains 304, 306, and 308 includes a number of scan-flops (e.g., a scan-flop 312) arranged in series, such as in manner the same or substantially similar to the scan-flop arrangement described with respect to FIG. 1.

In FIG. 3, multiplexors (e.g., 330, 332, 334) are present to facilitate selection of a scan chain (e.g., 304, 306, 308, 310) for loading either serial or parallel fashion with one another.

Gates 318, 320, 322 and 324 can either mask the respective chain or permit loading of the chain from a SCAN_IN port based on input from PROG_SCAN_IN. Block 314 is responsible for the compression of the test data output when scan chains are operated in parallel mode.

Figure 4:
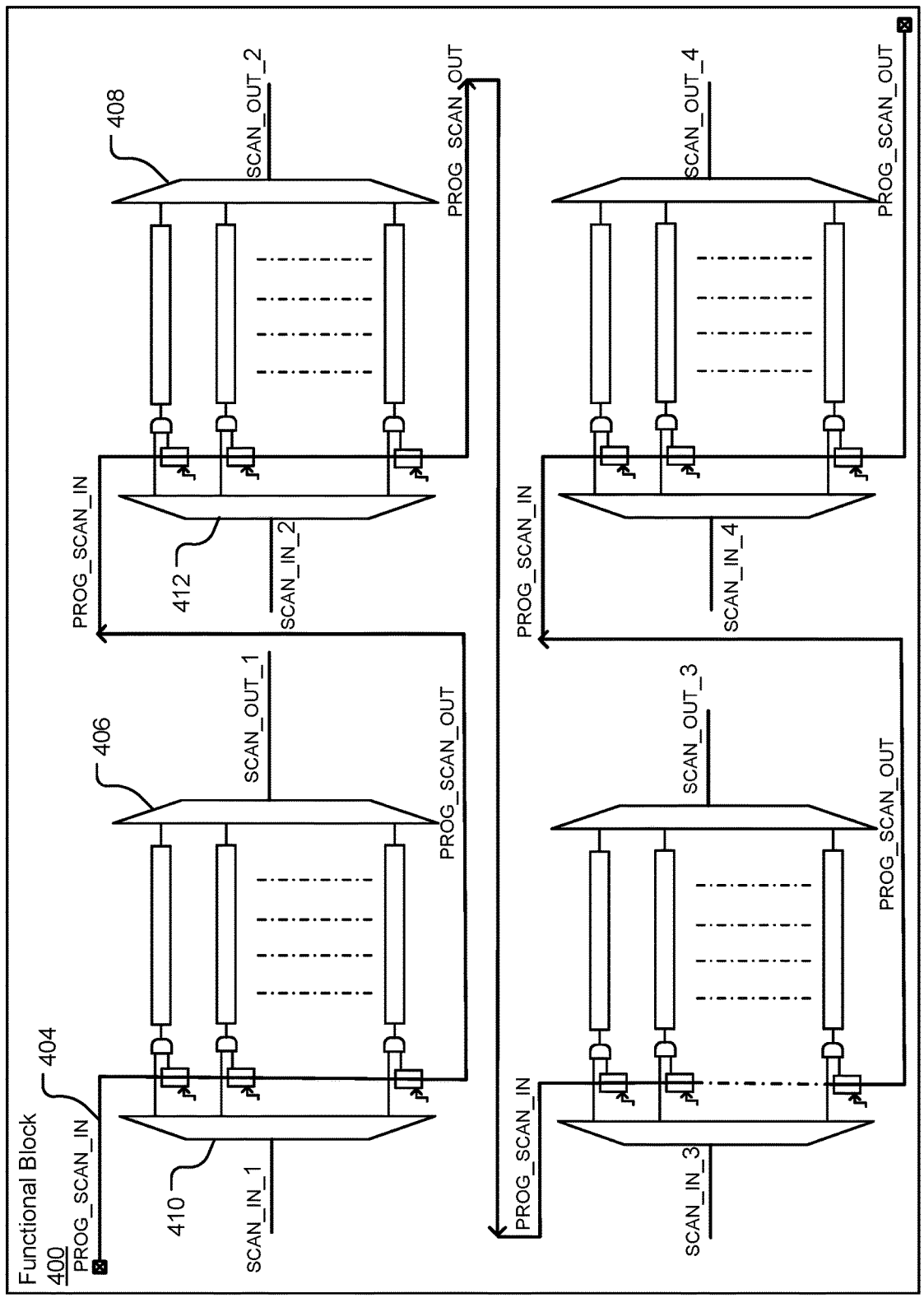
FIG. 4 illustrates yet another example functional block of a semiconductor chip that includes circuitry that facilitates selective isolation of individual scan chains during testing.

FIG. 4 illustrates yet another example functional block 400 of a semiconductor chip that includes circuitry that facilitates selective isolation of individual scan chains during testing. In particular, FIG. 4 illustrates a single programmable input line 404 configured to control an on/off state of multiple scan chains within different decompression/compression blocks (e.g., decompression blocks 410, 412 and compression blocks 406, 408).

Figure 5:
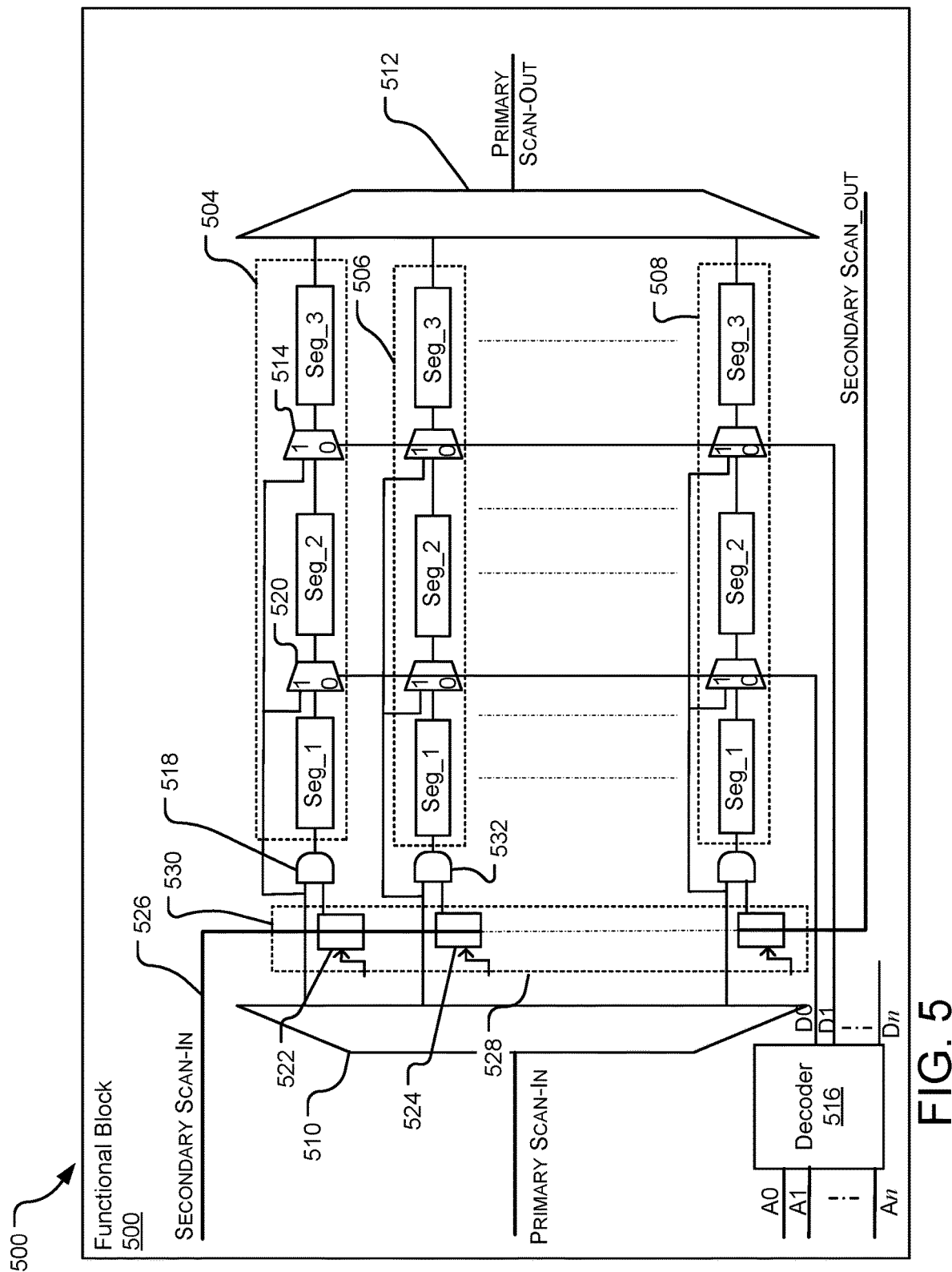
FIG. 5 illustrates an example functional block of a semiconductor chip that includes additional example circuitry to decrease toggling activity during scan chain testing without decreasing fault coverage.

FIG. 5 illustrates another example functional block 500 of a semiconductor chip that includes example circuitry to decrease toggling activity during scan chain testing with minimum impact on test coverage. Specifically, a decrease in toggling activity is achieved by selectively isolating toggling to individual scan chains or sub-combinations of scan chains (e.g., as described with respect to FIG. 2, above) and/or by isolating togging to individual segments (e.g., segment_1, segment_2, segment_3) within a scan chain. Each of the scan chains 504, 506, and 508 of the functional block 500 extends between a de-compressor logic block 510 and a compression logic block 512 and includes a number of scan-flops arranged in series, such as in manner the same or substantially similar to that described with respect to FIG. 1.

Within each of the scan chains 504, 506, and 508, each of the segments of scan-flops (e.g., segment_1, segment_2, segment_3) is separated from the immediately adjacent segment(s) by a multiplexor, also referred to herein as a segment-dividing multiplexor, such as segment-dividing multiplexors 514 and 520. Each of the segment-dividing multiplexors 514 and 520 receives a selection line input (1 or 0) from a decoder 516 programmed by a test controller (not shown). The programmed decoder inputs determine whether the multiplexor outputs a value received from the previous scan chain segment or a value received along a primary scan_in line 528. For example, when the decoder 516 provides an input of '0' to a selection line (D1) of the segment-dividing multiplexor 514, the segment-dividing multiplexor 514 outputs a value received from the immediately prior scan chain segment (segment_2). When, in contrast, the decoder 516 provides an input of '1' to the selection line (D1) of segment-dividing multiplexor 514 between segment_2 and segment_3, the segment dividing multiplexor 514 outputs a value received from the primary scan_in line 528. In this case, the scan chain 504 outputs values to the compression block 512 that reflect toggling activity captured exclusively by the scan-flops of segment_3. In effect, segment_1 and segment_2 are turned "off" for debugging and power purposes.

In yet another test configuration, segment_2 and segment_3 are selectively placed in an "on" configuration while segment_1 is placed in an "off" configuration. For example, the decoder 516 provides a '0' to the selection line (D1) of the segment-dividing multiplexor 514 between segment_2 and segment_3 and a '1' to a selection line (D0) of the segment-dividing multiplexor 520 between segment_1 and segment_2. As a result, the scan chain 504 outputs values that reflect toggling activity captured exclusively by the scan-flops of segment_2 and segment_3 combined, and segment_1 is effectively turned "off."

In yet another test configuration, segment_1, segment_2, and segment_3 are all placed in an "on" configuration when the decoder 516 provides 0's to each of the selection lines (D0 and D1) of the segment-dividing multiplexors 514 and 520. As a result, the scan chain 504 outputs values that reflect toggling activity of the full scan chain including segment_1, segment_2, and segment_3 combined. In this way, testing of the scan chain 504 can be confined to test the following groups of scan-flips: (1) segment_1, segment_2, and segment_3 together; (2) segment_2 and segment_3 combined; or (3) segment_3 alone. This simplifies the task of pinpointing the locations of faulty transistors and may reduce power draw during testing, particularly when power of the "off" segments is controlled as described with respect to FIG. 6, below.

Although the scan chains of FIG. 5 are shown to include three segments and two segment-dividing multiplexors, other scan chains implementing the disclosed technology may include any number of segment-dividing multiplexors. The length of each of the segments within the scan chain 504 may vary in different implementations. In one example implementation, the scan chain 504 includes 1000 scan-flops, and segment-dividing multiplexors are included at positions 25, 50, and 75 percent of the full chain length away from the first scan-flop in the scan chain 204.

In addition to facilitating selective isolation of the individual segments (e.g., segment_1, segment_2, and segment_3) within each of the scan chains 504, 506, and 506, the functional block 502 also includes circuitry for isolating (e.g., turning "on" and "off") individual scan chains. Similar to the embodiment described above with respect to FIG. 2, the functional block 500 includes gates (e.g., gates 518 and 532) for selectively turning "on" or "off" a corresponding scan chain based on a value loaded into a leading flip-flop (e.g., flip-flops 522, 524) from a secondary scan-in line 526. Notably some implementations of the disclosed technology may facilitate segment isolation but not chain isolation and vice versa.

Figure 6:
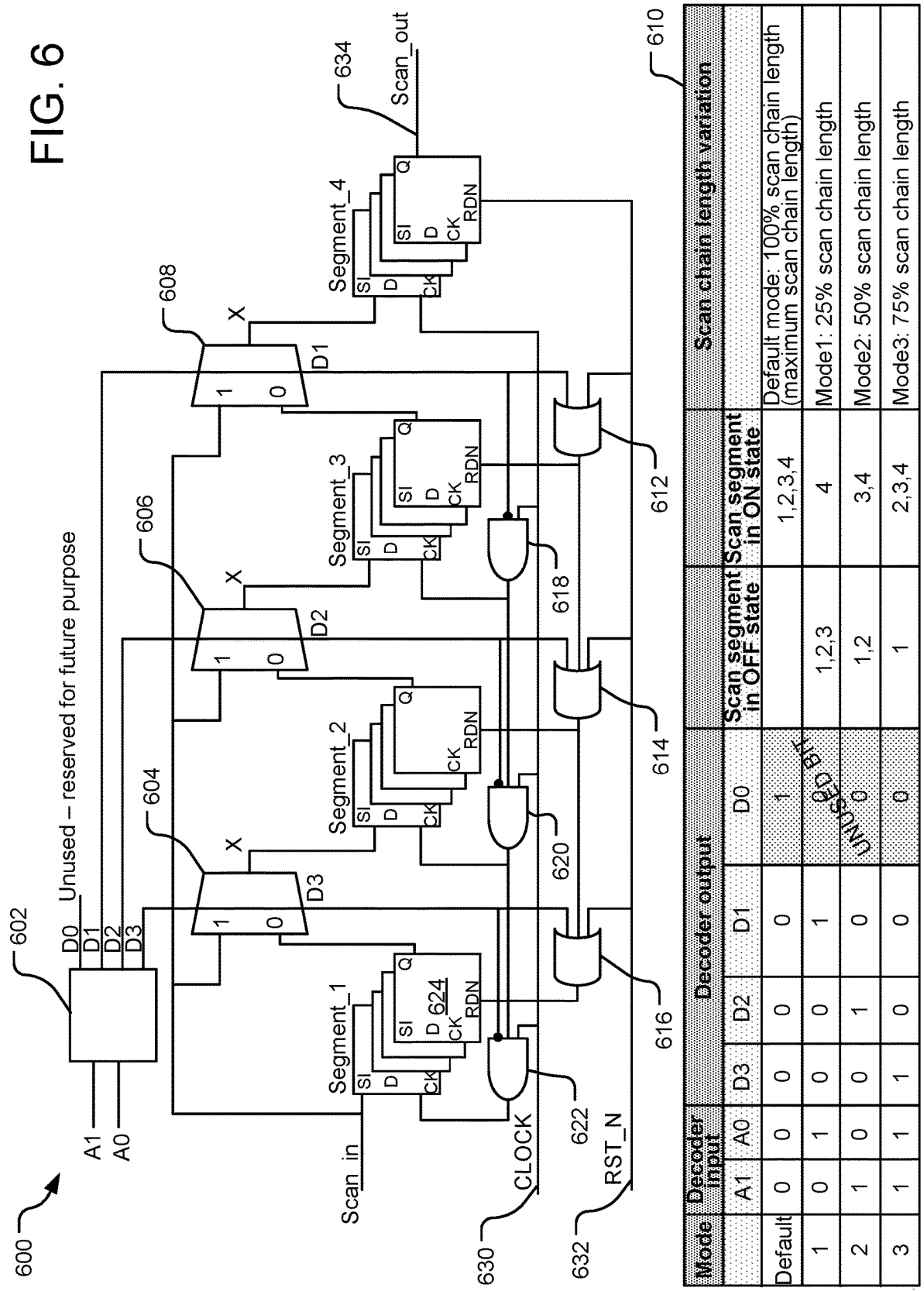
FIG. 6 illustrates an example scan chain that includes circuitry to facilitate selective testing of individual segments of a scan chain independent of one another.

FIG. 6 illustrates an example scan chain 600 that includes circuitry to facilitate selective testing of individual segments of the scan chain 600 independent of one another. In particular, the scan chain 600 includes four segments, labeled segment_1, segment_2, segment_3, and segment_4, and each of the four segments includes a number of scan-flops arranged in series (e.g., a scan-flop represented by box 624), such as in manner the same or substantially similar to the scan-flop arrangement described with respect to FIGS. 1 and 2. Each of the four segments is separated from the immediately adjacent segment(s) by a segment-dividing multiplexor (e.g., segment-dividing multiplexors 604, 606, and 608).

Each individual scan-flop is generally configured for selective receipt of input from: a scan-in pin (SI) and a functional mode pin (D). Additionally, each scan flop includes a clock pin input (CK) from a CLOCK input line 630, and a reset pin input (RDN) from a reset (RST_N) input line 632. As described below, various components (e.g., multiplexors and gates) provide for selective loading of the SI, CLOCK (CK), and RESET (RDN) pins.

To control an "on" or "off" state of the individual segments (e.g., segment_1, segment_2, segment_3, and segment_4), selection lines D1, D2, D2 of the segment-dividing multiplexors 604, 606, and 608 are selectively loaded with values from a decoder 602. A decoder table 610 indicates segment on/off states corresponding to different decoder outputs. For clarity of example, each of the different decoder states shown in the decoder table 610 is discussed separately, in turn, below.

In a first test state shown in the decoder table 610, each of the segments (segment_1, segment_2, segment_3, and segment_4) is in the "on" state. This is achieved when the selection lines D1, D2, and D3 of each of the segment-dividing multiplexors 604, 606, and 608 are each loaded with a decoder input of "0", because a "0" input to a segment-dividing multiplexor allows an output of the previous segment to flow as an input to the next segment. For example, a value of a last scan-flop in segment_1 may be shifted to a first scan-flop in segment_2 if the segment-dividing multiplexor 604 receives a "0" input along the selection line D3 from the decoder 602.

During an example loading sequence of the first test scenario (a "default" mode in the decoder table 610), the scan-flops are set to receive input via the SI pin, and scan test pattern values are propagated down the chain. During a "capture" phase of the test, the scan-flops receive input at a CK pin from the CLOCK line 630 to excite combinatorial logic (not shown) associated with each scan-flop. Some of the toggling of the combinatorial logic blocks is captured by scan-flops, and the SI input is again asserted to propagate stored values down the scan chain to a scan_out port 634. Values observed at the scan_out port 634 can then be compared to expected values to determine if the semiconductor chip has performed as expected.

Various logic gates control values provided to the CLOCK and RESET inputs of each scan-flop, as shown. As described below, the various logic gates allow for selective masking of the CK pin and selective assertion of '1' on the RDN pin in certain test scenarios to reduce current draw and also a total toggling frequency.

During the above described first test state, the segment-dividing multiplexors 604, 606, and 608 each receive a "0" along a corresponding selection line D1, D2, or D3 from the decoder 602. As a result, the CK and RDN pins of the scan-flops receive values that correspond to those input along the CLOCK line 630 and the RESET line 632, respectively. Thus, there is no selective masking of inputs provided to the CK or RDN input pins.

In a second test state shown in the decoder table 610, segment_4 is in an "on" state, while segment_1, segment_2, and segment_3 are in an "off" state. The selection line D1 of the segment-dividing multiplexor 608 is loaded with a decoder input of "1", and the selection lines D2 and D3 of the segment-dividing multiplexors 604 and 606 are loaded with a "0." In this test scenario, values stored in the first three segments (e.g., segment_1, segment_2, and segment_3) are not shifted into segment_4 during the shift-out phase of the scan chain testing. As a result, any pattern shifted out of the scan chain 600 reflects toggling activity exclusively captured by the scan-flops of segment_4.

Further, the '1' value asserted along the selection line D1 for the segment-dividing multiplexor 608 is provided to a series of gates that control values provided to CK and RDN pins of the previous scan-flops in the scan chain 600. In this second test state, a series of "OR" gates 612, 614, and 616 convey a "1" input to the RDN pin of each of the scan-flops in segment_1, segment_2, and segment_3. This has the effect of resetting the stored value in each of the scan-flops of these segments to '0.' In addition, the assertion of "1" along the selection line D1 for the segment-dividing multiplexor 608 also causes a "1" value to be received at gate 618, This "1" input to the gate 618 effectively masks the CK pins in segment_1, segment_2, and segment_3, such that these CK pins still receive a 0 when the CLOCK line value is "1." As a result, combinatorial logic associated with segment_1, segment_2, and segment_3 is not excited during the capture phase of scan testing, further reducing current drawn from the voltage source during the scan chain test.

In a third test state shown in the decoder table 610, segment_3 and segment_4 are both in the "on" state, while segment_1 and segment_2 are in an "off" state. The selection line D2 of the segment-dividing multiplexor 606 is loaded with a decoder input of "1", and the selection lines D1 and D3 of the segment-dividing multiplexors 604 and 608 are loaded with a "0." In this test scenario, values stored in the first two segments (e.g., segment_1 and segment_2) may not be shifted into segement_3 and segment_4 during the shift-out phase of the scan chain testing. As a result, any pattern shifted out of the scan chain 600 reflects toggling activity exclusively captured by the scan-flops of segment_3 and segment_4.

Further, the '1' value asserted along the selection line D2 for the segment-dividing multiplexor 606 is input to "OR" gates 614 and 616 convey a "1" input to the RDN pin of each of the scan-flops in segment_1 and segment_2. This has the effect of resetting the stored value in each of the scan-flops of these segments to '0.' In addition, the assertion of "1" along the selection line D2 for the segment-dividing multiplexor 606 also causes a "1" value to be received at a gate 620, which effectively masks the CLK pins in segment_1 and segment_2 such that a clock pulse along the CLOCK line 630 does not excite combinatorial logic associated with segment_1 and segment_2 during the "capture" phase of the scan test. This further reduces current drawn from the voltage source during the test.

In a fourth test state shown in the decoder table 610, segment_2, segment_3, and segment_4 are all in the "on" state, while segment_1 is in the "off" state. The selection line D3 of the segment-dividing multiplexor 604 is loaded with a decoder input of "1", and the selection lines D1 and D2 of the segment-dividing multiplexors 606 and 608 are loaded with a "0." In this test scenario, values stored in the first segment (e.g., segment_1) may not be shifted into the latter three segments during the shift-out phase of the scan chain testing. As a result, any pattern shifted out of the scan chain 600 reflects toggling activity exclusively captured by the scan-flops of segment_2, segment_3, and segment_4 combined.

Further, the '1' value asserted along the selection line D3 for the segment-dividing multiplexor 604 is provided to the OR gates 616 which, in turn, conveys a "1" input to the RDN pin of each of the scan-flops in segment_1. In addition, the assertion of "1" along the selection line D3 for the segment-dividing multiplexor 604 also causes a "1" value to be received at a gate 422, which effectively masks the CLOCK pin in segment_1 such that a clock pulse along the CLOCK line 630 does not excite combinatorial logic associated with segment_1 during the "capture" phase of the scan test. This further reduces current drawn from the voltage source during the test.

In one implementation, the default test scenario (e.g., with all segments "on") is selectively utilized for testing of certain scan patterns that correlate with low toggling activity. For example, test scan patterns that include primary 0s or primarily is do not draw as much power or create localized heat spots likely to cause damage or failure. Thus, it may be desirable to test scan patterns with low toggle activity with all segments in the "on" state to reduce the total time duration of the test. The other three above-described test states can be used for testing scan patterns associated with moderate or high toggle activity.

Figure 7:
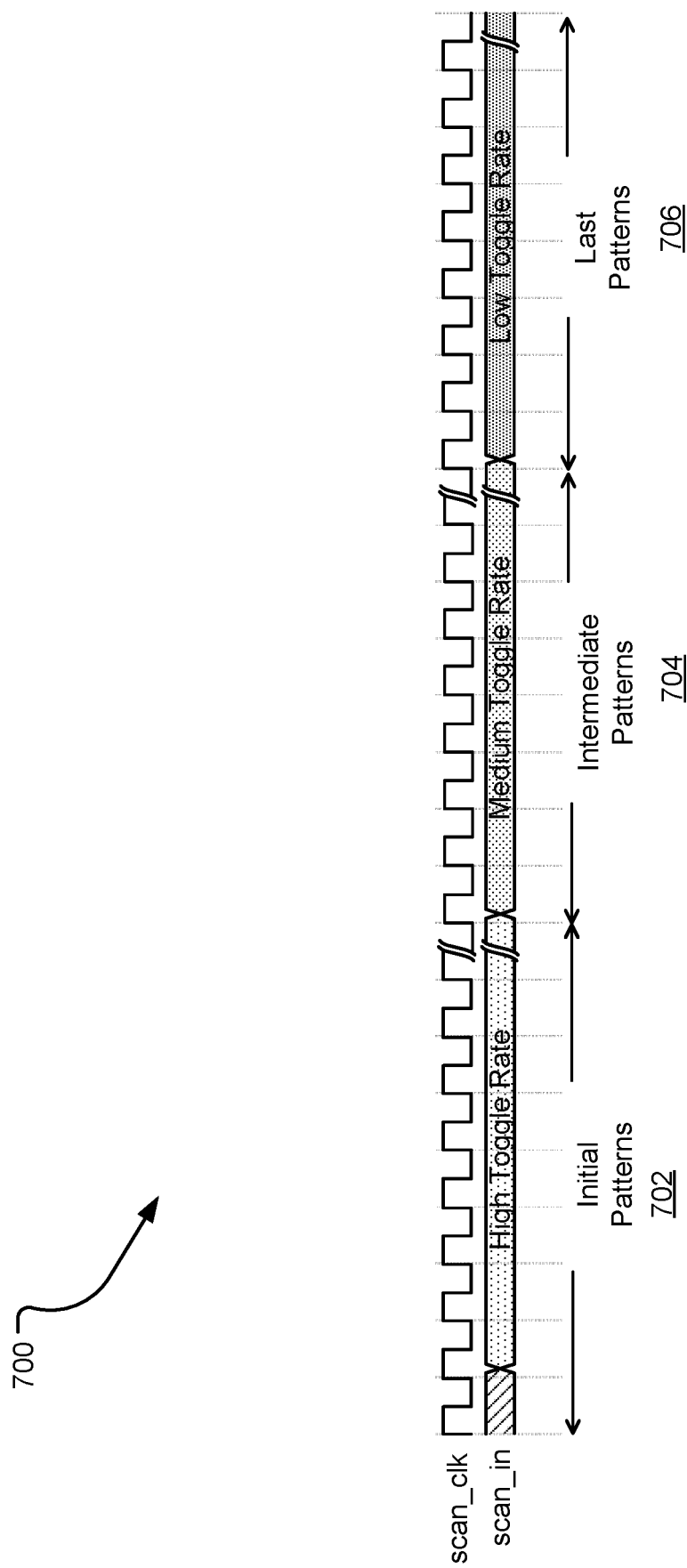
FIG. 7 illustrates example toggle activity of various scan chain test patterns that may be loaded into a scan chain during testing of a semiconductor chip.

FIG. 7 illustrates an example scan chain test 700 that entails loading and testing of multiple different scan chain test patterns into a shift register of a functional block to assess faults in each individual transistor of the functional block. During the scan chain test, multiple loading, capture, and un-loading scan chain test cycles are completed in association with each of the different scan chain test patterns. During an initial phase of the test, initial patterns 704 with a high toggle rate are tested. A "toggle" is a switch between a 0 and 1 or a 1 and 0. Therefore, an example high toggle pattern may entail testing a series of values with a large number of interspersed 1s and 0s (e.g., 0011001100).

After testing of the initial patterns 702 with the high toggle rate, one or more intermediate patterns 706 with a moderate toggle rate are tested. An intermediate toggle pattern includes fewer toggles than a high toggle pattern (e.g., 0000111000). After testing of the intermediate patterns 706 with the moderate toggle rates, one or more last patterns 708 with a low toggle rate are tested. A low toggle pattern includes fewer toggles than an intermediate toggle pattern (e.g., 0000100000).

Testing of high toggle activity test scan patterns may result in high current draw and a highest risk of detrimental "hot spot" formation. Thus, in one implementation, testing of these high activity scan test patterns is performed piecewise, by programming the shift register to selectively mask certain scan chain elements (e.g., entire chains and/or segments of individual chains) and test those different scan chain elements in isolation, such as using one or more of the selective masking techniques described with respect to FIG. 1-6, above. This decreased current draw and hot spot risk are achieved at the trade-off of an increase in the total time duration of the scan chain test.

Testing of moderate and low toggle activity test scan patterns results in lower current draw and a lower risk of detrimental "hot spot" formation than the high toggle activity patterns. Thus, it may be desirable to implement fewer instances of selective masking when testing these moderate or low toggle patterns in the interest of decreasing test time duration.

Figure 8:
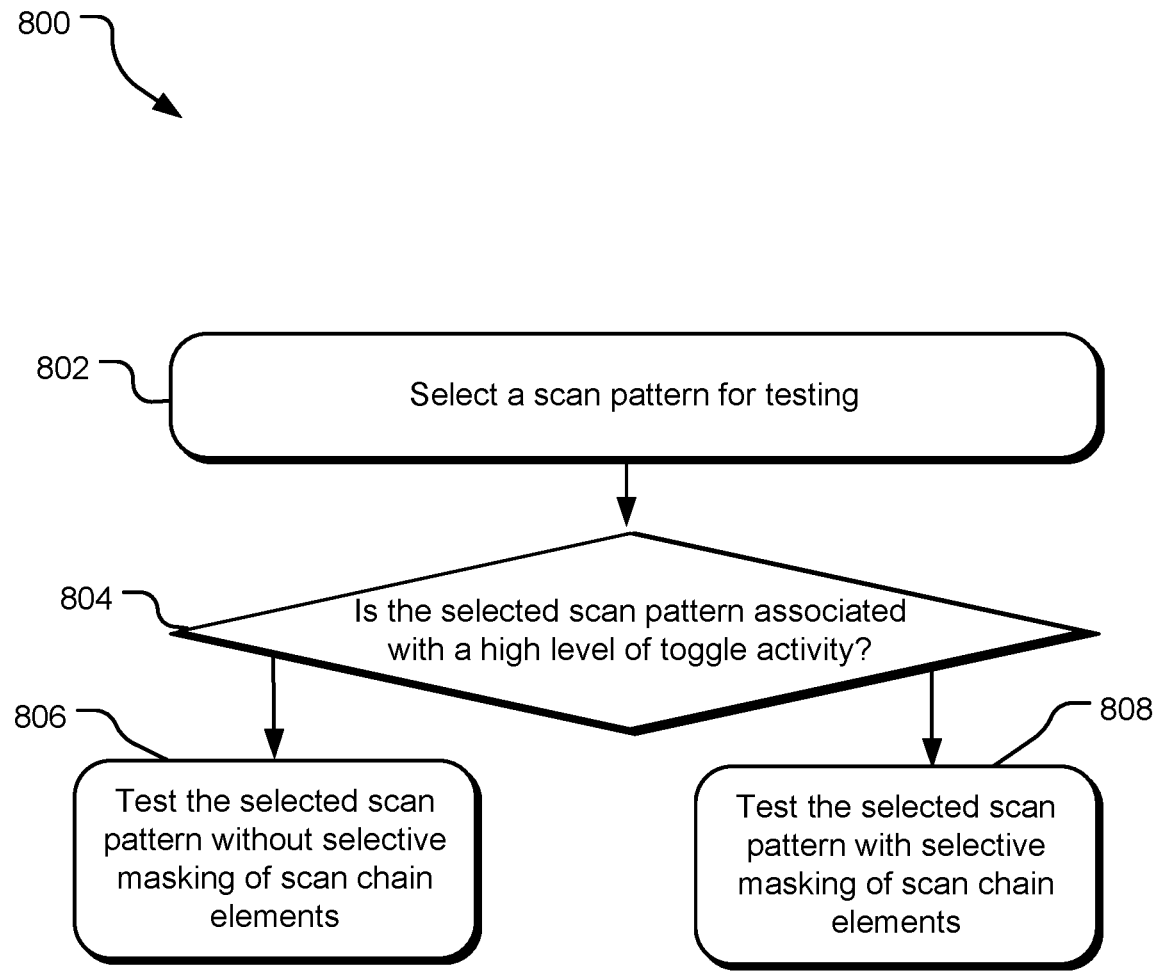
FIG. 8 illustrates example operations for scan chain testing of a functional block.

FIG. 8 illustrates example operations 800 for scan chain testing of a functional block. A selection operation 802 selects one of a plurality of scan patterns for testing. A determination operation 804 determines whether the selected scan pattern is associated with high toggle activity. In one implementation, a test scan pattern is determined to be associated with high toggle activity when the toggling activity of the pattern is more than the maximum toggling activity that the IC can tolerate or is designed for when operating in the normal/functional mode.

If the determination operation 804 determines that the selected scan pattern is not associated with high toggle activity, a testing operation 806 tests the selected scan pattern without implementing selective masking of scan chain elements. For example, testing of the selected scan pattern may entail a single loading, capture, and unloading sequence. Another test pattern is then selected by the selection operation 802.

If the determination operation 804 determines that the selected scan pattern is associated with high toggle activity, a testing operation 808 tests the selected scan pattern by selectively masking certain scan elements (e.g., individual scan chains and/or scan chain elements) and thereby testing elements of the scan chain in isolation of one another. For example, testing of the selected scan pattern may entail multiple loading, capture, and unloading sequences to test different segments of one or more scan chains and/or different scan chains in isolation of one another.

After the testing operation 806 or 808, the selection operation 802 selects another test pattern and the determination operation 804 and testing operation 806 or 808 are repeated until each a number of tested scan patterns mathematically provides fault coverage of a predetermined acceptable value.

The implementations of the invention described herein are implemented as logical steps in one or more computer systems. The logical operations of the present invention are implemented (1) as a sequence of processor-implemented steps executing in one or more computer systems and (2) as interconnected machine or circuit modules within one or more computer systems. The implementation is a matter of choice, dependent on the performance requirements of the computer system implementing the invention. Accordingly, the logical operations making up the embodiments of the invention described herein are referred to variously as operations, steps, objects, or modules. Furthermore, it should be understood that logical operations may be performed in any order, adding and omitting as desired, unless explicitly claimed otherwise or a specific order is inherently necessitated by the claim language.

The above specification, examples, and data provide a complete description of the structure and use of exemplary embodiments of the invention. Since many embodiments of the invention can be made without departing from the spirit and scope of the invention, the invention resides in the claims hereinafter appended. Furthermore, structural features of the different embodiments may be combined in yet another embodiment without departing from the recited claims.

What is claimed is:

1. A integrated circuit (IC) comprising:
multiple scan chains each including a series of scan-flops;
a plurality of leading gates each functioning as an on/off trigger for a corresponding one of the multiple scan chains, each of the plurality of leading gates having a first gate input configured to receive a test pattern programmed via a first scan-in port and a second gate input configured to receive an on/off scan chain indicator programmed via a second scan-in port;
a group of scan-flops external to the multiple scan chains, each scan-flop in the group being directly connected to an associated gate of the plurality of leading gates and storing the on/off scan chain indictor for the associated gate, the on/off scan chain indicator functioning to configure a corresponding one of the multiple scan chains in an on or off state.

2. The IC of claim 1, wherein the series of scan-flops in a first chain of the multiple scan chains includes at least a first segment of scan-flops and a second segment of scan-flops, the second segment configured to receive an output from the first segment, and wherein the IC further includes:
a first multiplexor positioned between the first segment and the second segment that is configured to selectively supply scan input from a test controller to the second segment while preventing the second segment from receiving an output of the first segment; and
one or more logic gates configured to reset the scan-flops of the first segment while the first multiplexor supplies the scan input to the second segment.

3. The IC of claim 2, wherein the one or more logic gates include an OR gate receiving as an input a selection line input of the first multiplexor and an input from a reset pin, the OR gate supplying an output to the first segment that selectively configures the scan-flops of the first segment in a reset mode.

4. The IC of claim 2, further comprising one or more logic gates configured to mask a clock input to the first segment while the first multiplexor is supplying the scan input to the second segment.

5. The IC of claim 2, wherein the first chain further includes a third segment separated from the second segment by a second multiplexor, the second multiplexor positioned between the first segment and the second segment and configured to selectively supply the scan input to the third segment while preventing the third segment from receiving output of the first segment and output of the second segment.

6. The IC of claim 1, wherein the plurality of leading gates consists of a plurality of AND gates.

7. Apparatus comprising:
   multiple scan chains connected in series;
   a plurality of leading gates, each leading gate of the plurality of leading gates being coupled to one of the multiple scan chains and including:
      a first gate input configured to receive a scan test pattern;
      a second gate input configured to receive an on/off scan chain indicator; and
      a gate output that functions as an on/off trigger for the associated scan chain;
   a test controller including computer-executable instructions stored in memory and executable by a processor to:
      load the test pattern into the first gate input of the leading gate connected to a first scan chain of the multiple scan chains; and
      selectively mask a second scan chain of the multiple scan chains by loading the on/off scan chain indictor to a scan-flop directly connected to the second gate input of the leading gate of the second scan chain, the selective masking preventing the second scan chain from receiving the scan test pattern from the first scan chain.

8. The apparatus of claim 7, further comprising:
   supplying a selected decoder input to a selection line of a first multiplexor positioned between a first segment and a second segment of the first scan chain, the decoder input controlling the first multiplexor to supply values of the selected scan test pattern to the second segment while preventing the second segment from receiving an output of the first segment.

9. The apparatus of claim 8, wherein the first scan chain is coupled to one or more logic gates configured to reset scan-flops of the first segment while the test controller supplies the selected decoder input to the selection line of the first multiplexor.

10. The apparatus of claim 9, wherein the one or more logic gates include an OR gate configured to receive the selected decoder input and an input from a reset pin, the OR gate supplying an output to the first segment of the first scan chain to configure the first segment in a reset mode responsive to receipt of the selected decoder input along the selection line of the first multiplexor.

11. The apparatus of claim 9, wherein the first scan chain is further coupled to one or more logic gates configured to mask a clock input to the first segment of the first scan chain responsive to receipt of the selected decoder input along the selection line of the first multiplexor.

12. A method comprising:
   loading a scan test pattern into a first scan chain during a loading sequence of a scan chain test, the first scan chain being included in a series of multiple scan chains each being coupled to a corresponding leading gate of a plurality of leading gates, each of the leading gates including:
      a first gate input configured to receive a scan test pattern;
      a second gate input configured to receive an on/off scan chain indicator; and
      a gate output that functions as an on/off trigger for the associated scan chain;
   and
   selectively masking inputs to a select scan chain of the multiple scan chains by loading the on/off scan chain indicator to a scan-flop directly connected to the second gate input of the leading gate of the select scan chain, the selective masking preventing the select scan chain from receiving the scan test pattern from the first scan chain.

13. The method of claim 12, further comprising:
   supplying a selected decoder input to a selection line of a first multiplexor positioned between a first segment and a second segment of the first scan chain, the decoder input controlling the first multiplexor to supply values of the selected scan test pattern to the second segment while preventing the second segment from receiving an output of the first segment;
   loading the values of the selected scan test pattern to a primary scan input coupled to the first multiplexor;
   providing a clock pulse input to scan-flops of the second segment; and
   unloading values stored in the second segment subsequent to the receipt of the clock pulse.

14. The method of claim 13, further comprising:
   supplying the selected decoder input to one or more logic gates configured to reset scan-flops of the first segment while the selected decoder input controls the first multiplexor to prevent outputs of the first segment of the scan chain from being received by the second segment of the chain.

15. The method of claim 13, further comprising:
   supplying the selected decoder input to an OR gate configured to also receive an input from a reset pin, the OR gate supplying an output to the first segment of the first scan chain to configure the first segment in a reset mode when the selected decoder input is supplied the selection line of the first multiplexor.

16. The method of claim 13, further comprising:
   supplying the selected decoder input to one or more logic gates configured to mask a clock input to the first segment of the first scan chain responsive to receipt of the selected decoder input along the selection line of the first multiplexor.

* * * * *